United States Patent
Huff et al.

(10) Patent No.: US 8,660,157 B2
(45) Date of Patent: *Feb. 25, 2014

(54) MEANS FOR IMPROVED IMPLEMENTATION OF LASER DIODES AND LASER DIODE ARRAYS

(75) Inventors: Michael A. Huff, Oakton, VA (US); Jonah Jacob, Brookline, MA (US)

(73) Assignee: Corporation for National Research Initiatives, Reston, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/549,705

(22) Filed: Jul. 16, 2012

(65) Prior Publication Data

US 2012/0281725 A1  Nov. 8, 2012

Related U.S. Application Data

(62) Division of application No. 12/232,655, filed on Sep. 22, 2008, now Pat. No. 8,243,766.

(60) Provisional application No. 60/974,204, filed on Sep. 21, 2007, provisional application No. 61/034,611, filed on Mar. 7, 2008.

(51) Int. Cl.
*H01S 3/04* (2006.01)

(52) U.S. Cl.
USPC .............. 372/36; 372/34; 438/122; 438/26

(58) Field of Classification Search
USPC ................... 372/36, 34; 438/122, 26
See application file for complete search history.

(56) References Cited

U.S. PATENT DOCUMENTS

| | | | |
|---|---|---|---|
| 6,606,251 B1 | 8/2003 | Kenny et al. | |
| 8,304,324 B2* | 11/2012 | Huff | 438/458 |
| 2003/0142712 A1 | 7/2003 | Ikeda et al. | |
| 2005/0074041 A1 | 4/2005 | Sommerer et al. | |
| 2006/0001032 A1* | 1/2006 | Murofushi et al. | 257/79 |
| 2006/0160330 A1 | 7/2006 | Kobayashi et al. | |
| 2009/0286382 A1 | 11/2009 | Huff | |

OTHER PUBLICATIONS

Office Action, Mailed Mar. 21, 2012 in U.S. Appl. No. 12/232,657, filed Sep. 22, 2008.

* cited by examiner

*Primary Examiner* — Kinam Park
(74) *Attorney, Agent, or Firm* — Nixon & Vanderhye, PC

(57) ABSTRACT

A laser diode system is disclosed in which a substrate made of a semiconductor material containing laser diodes is bonded to a substrate made from a metallic material without the use of any intermediate joining or soldering layers between the two substrates. The metal substrate acts as an electrode and/or heat sink for the laser diode semiconductor substrate. Microchannels may be included in the metal substrate to allow coolant fluid to pass through, thereby facilitating the removal of heat from the laser diode substrate. A second metal substrate including cooling fluid microchannels may also be bonded to the laser diode substrate to provide greater heat transfer from the laser diode substrate. The bonding of the substrates at low temperatures, combined with modifications to the substrate surfaces, enables the realization of a low electrical resistance interface and a low thermal resistance interface between the bonded substrates.

66 Claims, 10 Drawing Sheets

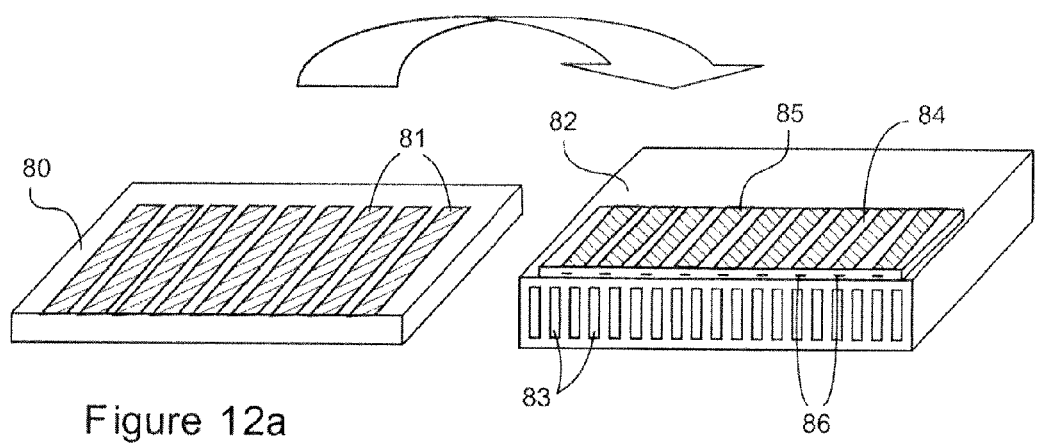
Figure 12a
Figure 12b
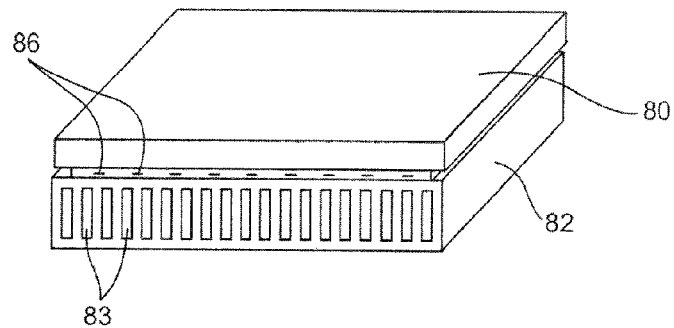
Figure 12c

MEANS FOR IMPROVED IMPLEMENTATION OF LASER DIODES AND LASER DIODE ARRAYS

CROSS-REFERENCES TO RELATED APPLICATIONS

This application is a divisional of application Ser. No. 12/232,655, filed Sep. 22, 2008, which claims the benefit of U.S. Provisional Application No. 60/974,204, filed Sep. 21, 2007 and U.S. Provisional Application No. 61/034,611, filed Mar. 7, 2008, the entire contents of each of which are hereby incorporated by reference in this application.

FIELD OF INVENTION

The present invention relates to an improved implementation for systems containing laser diodes and laser diode arrays, involving the bonding of a substrate containing one or more solid-state laser diodes to another substrate made of a metal, or metal alloy. In addition, the present invention is applicable to other electronic fields including integrated circuits and MIMICs.

BACKGROUND OF THE INVENTION

The implementation of laser diodes systems for most applications involves the joining together of a semiconductor substrate containing the laser diode(s) or a laser diode arrays to a metallic substrate. This implementation approach has always involved the use of an intermediate layer of solder between the two substrates to provide sufficient adhesive strength for practical applications.

The joining or mating together of metal substrates to laser diode or laser diode array semiconductor substrates is performed for one or more of the following reasons. First, to provide increased mechanical stiffness and strength to fragile semiconductor substrates, which are typically made from single crystal materials. Second, to provide one or more electrical connections to the semiconductor substrate, so as to allow electrical currents and voltages to be applied to the laser diode or laser diode array devices for them to operate.

Third, to provide the ability to move heat away from the semiconductor device(s), which typically heat up very significantly during operation. Specifically, the metal substrate functions as a thermal heat sink or thermal heat spreader that facilitates the removal of heat from the laser diodes made in the semiconductor substrate. The metal heat sink may employ cooling fins, channels and/or other fluid handling structural shapes or elements to facilitate an increased heat transfer rate from the metal to a cooling fluid or cooling device.

Fourth, to facilitate the packaging of the laser diode device(s), and thereby, (1) protect the semiconductor laser diode device(s) from the environment, (2) facilitate the electrical connection to the semiconductor laser diode device(s), (3) facilitate the optical connection to the semiconductor laser diode device(s), (4) protect the semiconductor laser diode device(s) from damage during use and handling, and/or, (5) keep the semiconductor laser diode device(s) clean from dust and other airborne particulate matter.

The use of an intermediate layer or layers, such as solders, between a metal substrate and a semiconductor substrate, as currently practiced, can have many disadvantages and shortcomings.

The use of intermediate layer(s) made from the solders and adhesives that are commonly used for joining laser diode semiconductor substrates to metal substrates can result in large "built-in" residual stresses that can have detrimental effects on the performance of the semiconductor laser diode devices. The differing thermal expansion coefficients of the metal and semiconductor substrates, combined with the elevated temperatures required to perform the soldering process, as well as thermal stresses resulting from the heating of the laser diodes when operating, can result in significant built-in stresses between the mated substrates once they are cooled to room temperature, as well as during operation.

These built-in stresses can cause the bandgaps and energy states in the semiconductor material to be altered, thereby modifying the device behavior such as shifting the wavelength of the laser radiation for a solid-state laser diode.

Large built-in stresses have also been known to appreciably lower the reliability of semiconductor laser diode devices, which frequently heat-up due to the power dissipated during operation, thereby resulting in large thermal stresses developing between the mated semiconductor and metal substrates. The thermal stress can become sufficiently large so as to result in the fracture of the semiconductor substrate and/or the substrates breaking or coming apart due to a failure at the soldered interface over one or more operational cycles.

Additionally, the solders used to join metals to semiconductor substrates containing laser diodes can re-flow from the interface to other areas of the device and/or package, which can result in a number of problems, such as the electrical shorting of the device, the forming of an open circuit condition and/or the solder material encroaching onto the output facet, thereby severely decreasing the amount of laser radiation emanating from the laser diode as well as other problems.

Relatively small temperature increases (few degrees Celsius), can also result in very large decreases in the reliability of laser diodes. Therefore, any phenomena resulting in a slight over-temperature of the semiconductor substrate will have significant and negative effects on the laser diode device reliability.

Soldering processes typically use a flux material to facilitate the soldering. These flux material mixtures are highly corrosive and, as a by-product of the soldering process, some residual flux will be left remaining on the surfaces after the joining process has been completed. This residual flux material can have a negative impact on the performance and reliability of the semiconductor laser diode device(s) and/or the metal substrate.

Consequently, it would be desirable to be able to implement laser diodes and laser diode array systems where these and other disadvantages are eliminated or reduced and this can be achieved by directly bonding a metal substrate to a semiconductor substrate containing laser diodes or laser diode arrays without the use of an intermediate solder layer. Moreover, it would be even more desirable if the bonding between the semiconductor and metal substrates could be performed at low temperatures. Additionally, it would be desirable if the metal substrate can be adjoined to both sides of the semiconductor substrate without the use of a solder.

SUMMARY OF INVENTION

The present invention relates to the implementation of systems containing laser diode and laser diode arrays whereby a semiconductor substrate containing laser diodes or laser diodes arrays is bonded to a metallic substrate without the use of any intermediate solder layers between the two substrates. The present invention has utility in device fabrication, systems integration, as well as for packaging of devices, and is very useful for many applications, since it can improve the performance and reliability as well as reduce the fabrication and packaging complexity and cost for a large and increasing number of laser diode devices, integrated circuits, MIMICs, other semiconductor devices and systems.

The present invention involves the bonding of substrates, wherein the thermal resistance across the bonded interface between a power dissipating semiconductor laser diode device(s) and a metal substrate (that may be serving as a heat sink) can be reduced, thereby allowing the active laser diode device(s) to be kept at lower operational temperatures for a given power dissipation. The present invention provides a means to make low electrical resistance contacts between a metal substrate material and a semiconductor substrate material, thereby allowing voltage and/or current to be directly applied to the laser diode device(s). The present invention encompasses a means to increase the reliability and/or power of laser diodes, high-power laser diodes, as well as enabling individual addressability and enhanced operational control through the merging of different semiconductor and metal substrates or different material types. The present invention also provides a means for bonding of material substrates having different thermal expansion coefficients at relatively low temperatures (i.e., approximately 400 degrees Celsius or less).

The present invention further provides a means of packaging semiconductor laser diode device(s) without the use of solders or adhesive agents so as to protect the laser diode device(s) from the environment.

The present invention further provides a means of bonding a multiplicity of metal and semiconductor substrates to one another, wherein at least one of the semiconductor substrates contains laser diodes or laser diodes arrays so as to merge different technologies (i.e., merge MEMS with microelectronics, merge MEMS with photonics, etc.) together to form a multi-technology-based system.

The present invention is also directed to improved methods of merging a semiconductor substrate containing laser diode or laser diode array devices with a metal substrate to facilitate better cooling or higher performance of systems containing laser diode devices.

BRIEF DESCRIPTION OF THE DRAWINGS

FIG. 12 is an illustration of a laser diode bar containing a plurality of laser diode emitters wherein each laser diode emitter has its own individual electrode fabricated onto the top surface of the semiconductor substrate and where this semiconductor substrate is bonded to a second substrate having metal patterned into individual electrodes on the surface and where the electrodes on the first and second substrates are aligned and contacted during bonding so as to enable individual addressability to the individual laser diode emitters.

DETAILED DESCRIPTION OF THE INVENTION

The present invention is directed to the implementation of laser diode systems in which one or more laser diode substrates are bonded to one or more metal substrates without the use of any intermediate soldering layer(s) between the two substrates. The presently described invention can be used for device fabrication, as well as for packaging of devices, and is very useful for many applications since it provides a lower thermal resistance across heterogeneous material interfaces. It also provides a low electrical resistance across a metal to semiconductor interface. Furthermore, this invention reduces fabrication and packaging complexity, as well as cost for a large and increasing number of photonic devices and systems.

Figure 1:
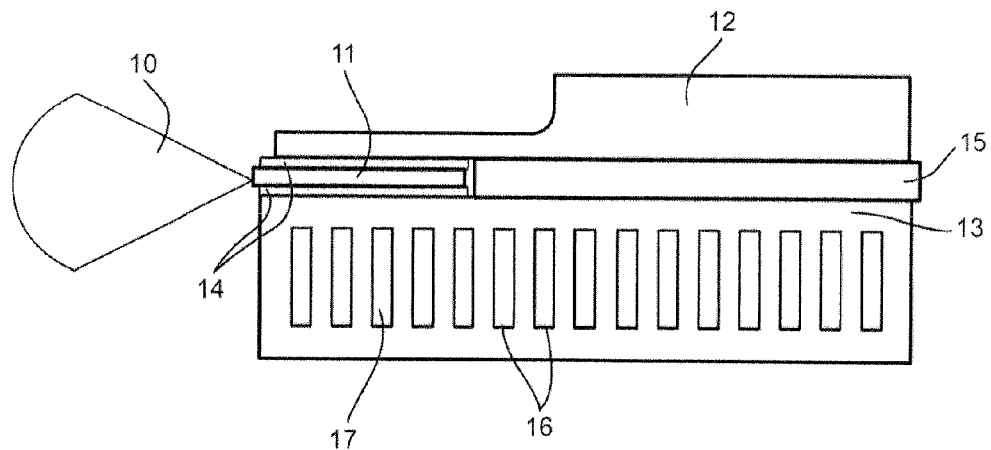
FIG. 1 is an illustration of a currently used implementation for a laser diode system, whereby an intermediate solder layer is used to attach the laser diode device to a metal substrate that functions as both a heat sink and as an electrode to the laser diode device. In this implementation, the laser diode or laser diode array is mated to a heat sink with microchannel cooling capability fabricated into the heat sink to facilitate the removal of heat from the laser diode(s).

FIG. 1 is an illustration of a currently used implementation of laser diode systems in which the laser diodes are currently adjoined to metal substrates using a solder as an intermediate layer between the substrates. The intermediate material typically used in this application is either composed of Gold-Tin (AuSb) solder or Indium (In) solder. FIG. 1 illustrates some of the shortcomings of the present implementation approaches. Specifically, FIG. 1 is a cross section of a laser diode bar semiconductor device 11 that generates a beam 10 and that has been affixed to a top metal substrate 12 and bottom metal substrate 13. Both the top metal substrate 12 and bottom metal substrates 13 provide two functions in this application configuration. First, both of these metal substrates (mostly the bottom metal substrate 13, and to a lesser degree, the top metal substrate 12) function as heat sinks to help remove excess heat from the laser diode bar semiconductor device 11. The laser diode bar 11 will dissipate a significant amount of power when operating, which results in the laser diode bar 11 reaching excessive temperatures, thereby potentially resulting in a catastrophic failure of the laser diode bar 11 and/or reducing the lifetime of the laser diode bar 11. Second, the metal substrates 12 and 13 also function as electrodes to the laser diode bar 11, with the top metal substrate 12 typically functioning as an n-type contact to the laser diode bar 11, and the bottom metal substrate 13 typically functioning as a p-type contact to the laser diode bar 11.

Typically, the material chosen for the metal substrates 12 and 13 has a high thermal conductance to facilitate the conduction of heat away from the laser diode bar 11. Also, the material chosen for the metal substrates 12 and 13 has a high electrical conductivity to facilitate making electrical contact to the laser diode bar semiconductor device 11. Furthermore, the material chosen for the metal substrates 12 and 13 may be reasonably matched in coefficient of thermal expansion (CTE) to the CTE of the semiconductor material used in the laser diode bar 11. The bottom metal substrate 13 may also have microchannels 16 formed in this substrate to allow a coolant fluid 17, such as water, to pass through the substrate 13, and thereby, facilitate the removal of heat away from the laser diode bar 11.

The laser diode bar 11 is soldered to the top metal substrate 12 and bottom metal substrate 13 using an intermediate material layer of solder 14. Typically, this solder 14 may be a combination of Gold (Au) and Tin (Sn) or Indium (In), but other soldering material choices may be used. Also, a spacer layer of an electrically insulating material 15 is inserted in a gap formed between the sandwiched laser diode bar 11 and the top and bottom metal substrates 12 and 13.

Figure 2:
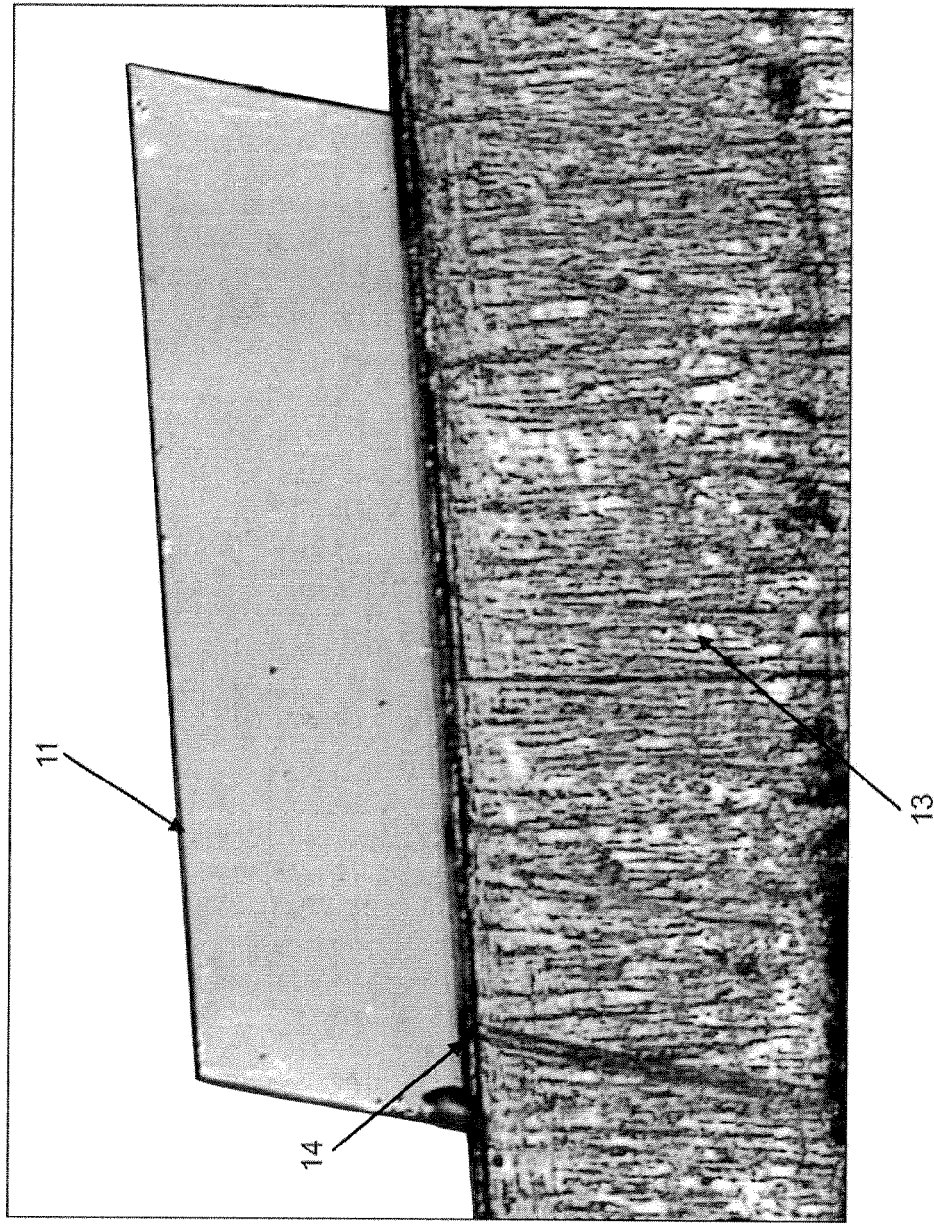
FIG. 2 is a photograph of a currently used implementation for laser diode system wherein a Gallium Arsenide (GaAs) laser diode or laser diode array (or bar) substrate has been soldered to a metal substrate.

FIG. 2 is a photograph displaying the solder interface 14 between the laser diode bar 11 and the bottom metal substrate 13. The photograph of FIG. 2 is taken "end on" to the laser diode bar 11. The laser diode bar shown in FIG. 2 is the diode's facet, which will emit the laser light radiation during operation. The solder interface 14 used to join the laser diode semiconductor substrate to the metal bottom electrode and heat sink 13 is clearly shown in FIG. 2. The top electrode is not shown in this Figure.

Figure 3:
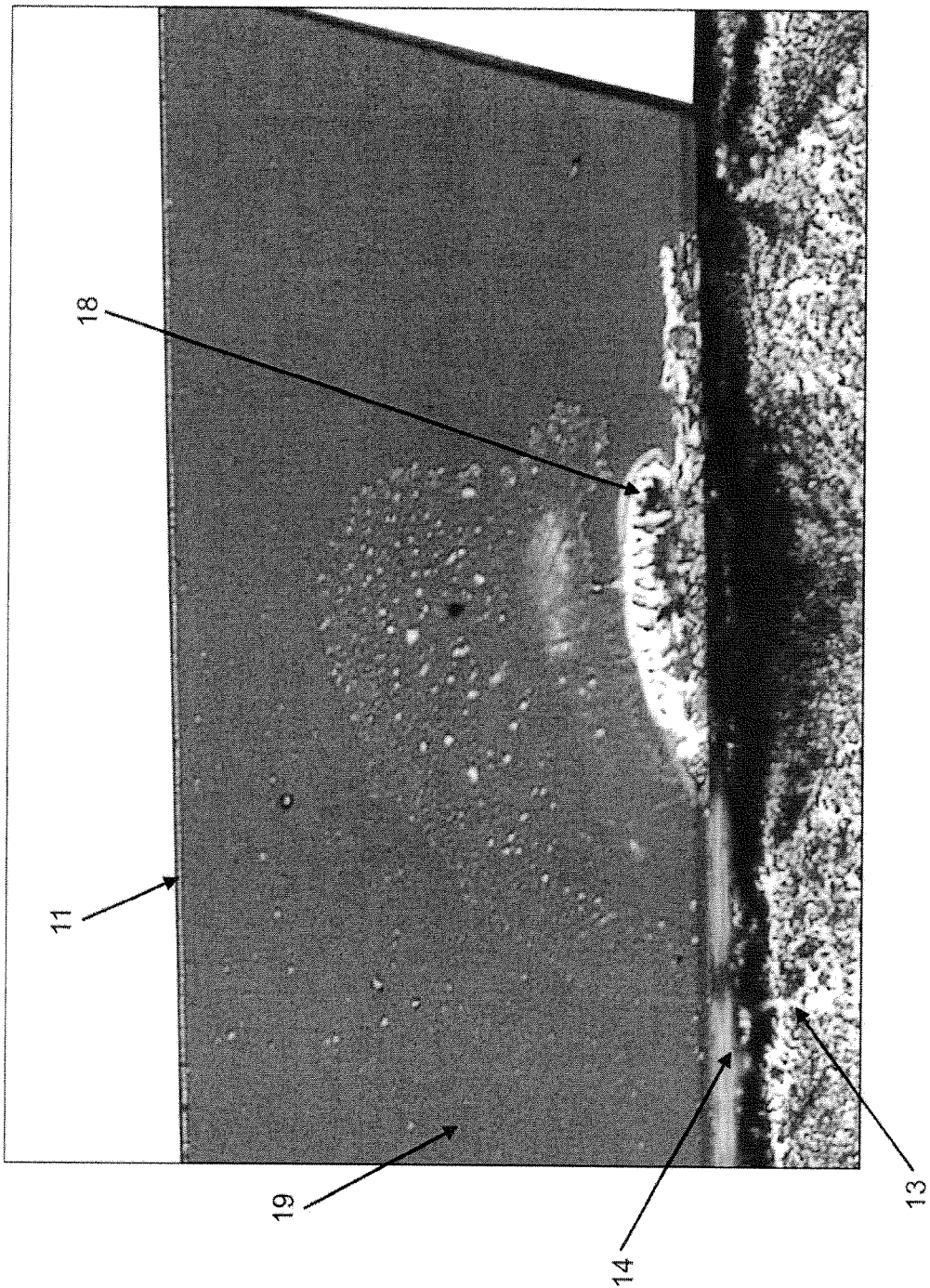
FIG. 3 is a photograph of a laser diode substrate that was soldered to a metal substrate, and over the period of operation of the laser diode, the solder material re-flowed and migrated onto the output facet of the laser diode.
Figure 5A:
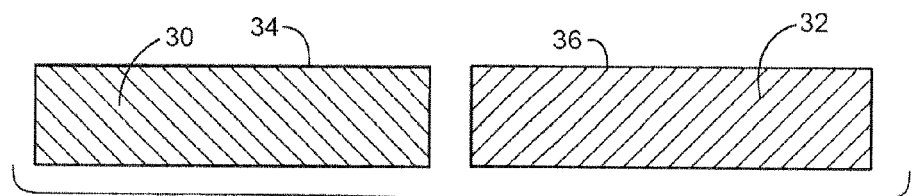
FIG. 5 is a series of cross-sectional views illustrating the general process for bonding a laser diode semiconductor substrate to a metal substrate.
Figure 5B:
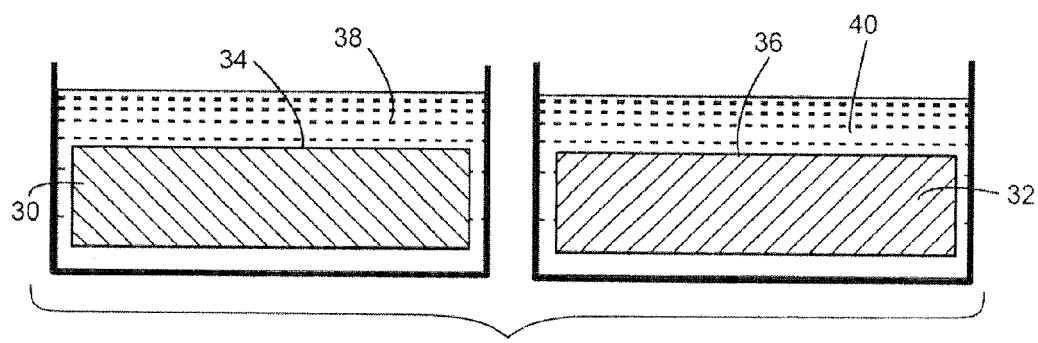
Figure 5C:
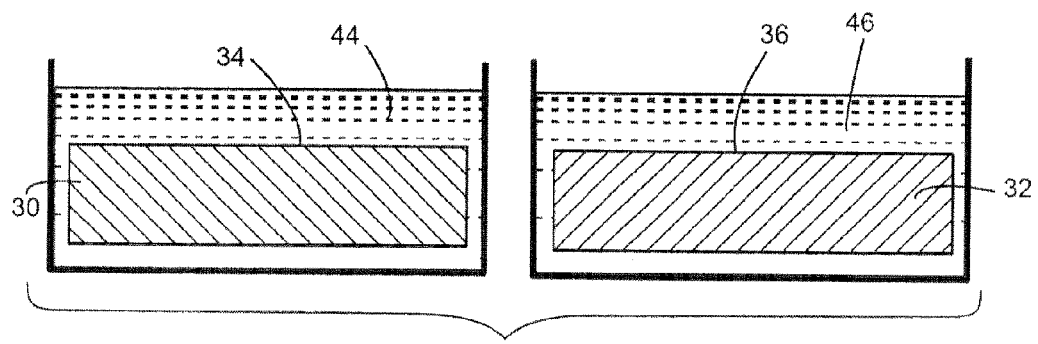
Figure 5D:
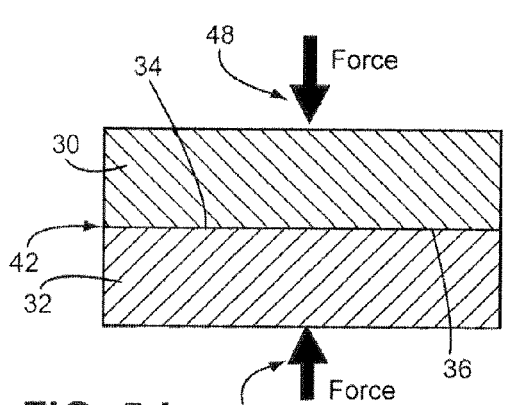
Figure 5E:
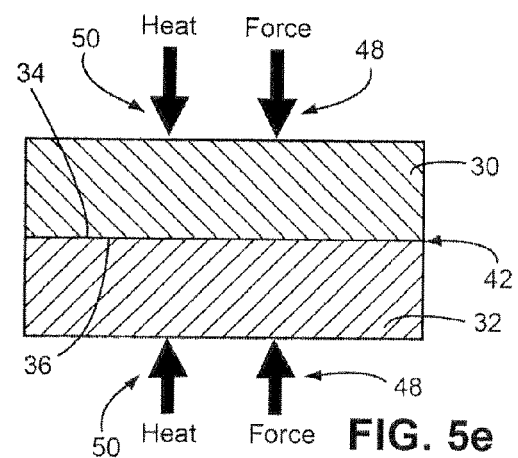
Figure 6A:
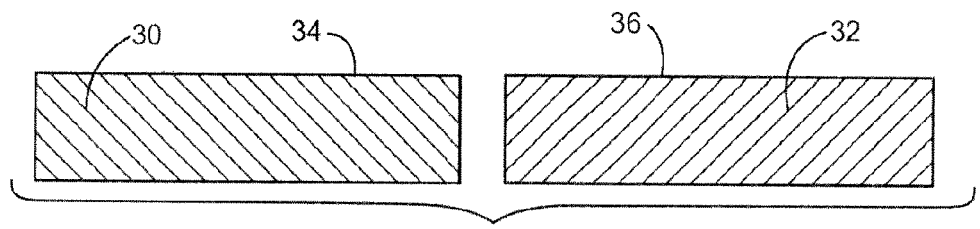
FIG. 6 is a series of cross-sectional views illustrating a process for depositing a very thin layer of Palladium, Gold or both on the surface of the laser diode substrate to bonding in order to obtain a low electrical resistance (i.e., ohmic contact) across the interface between the substrates.
Figure 6B:
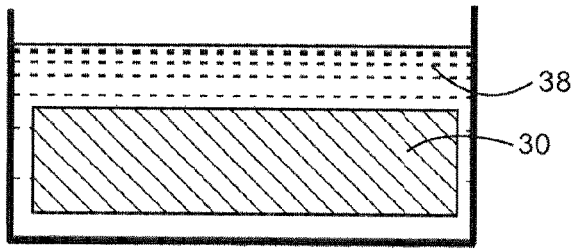
Figure 6C:
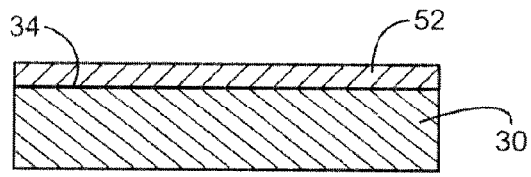
Figure 6D:
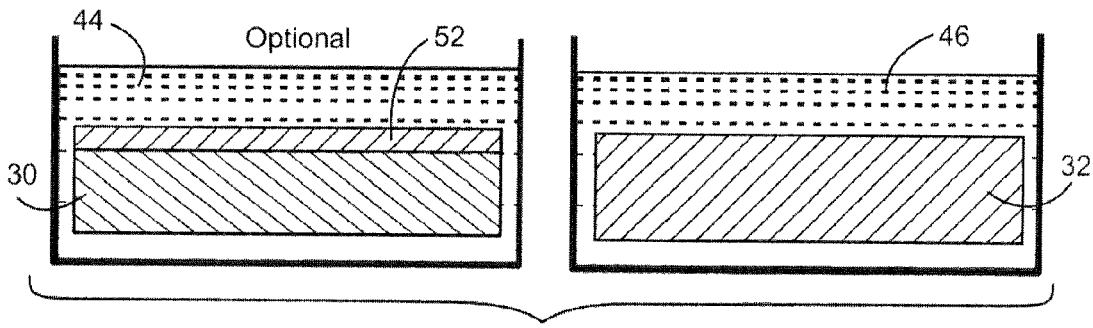
Figure 6E:
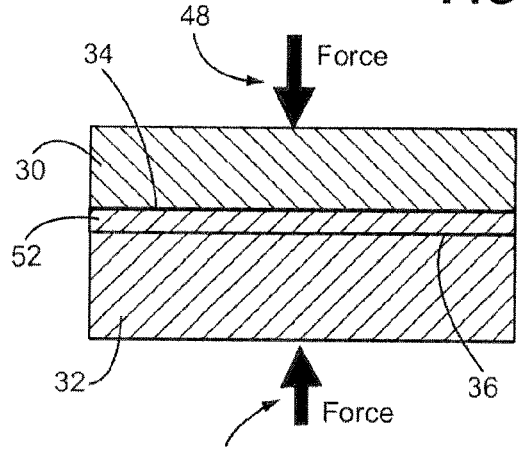
Figure 6F:
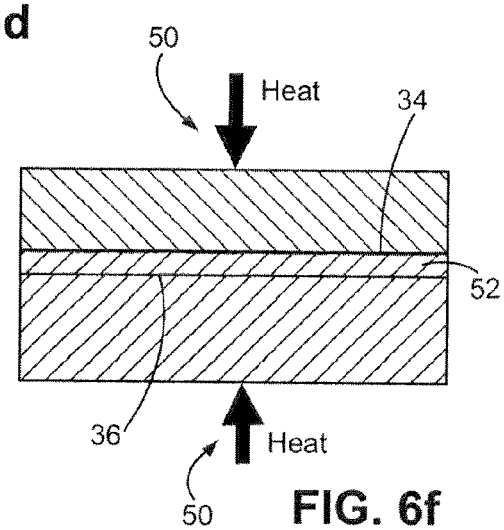
Figure 7A:
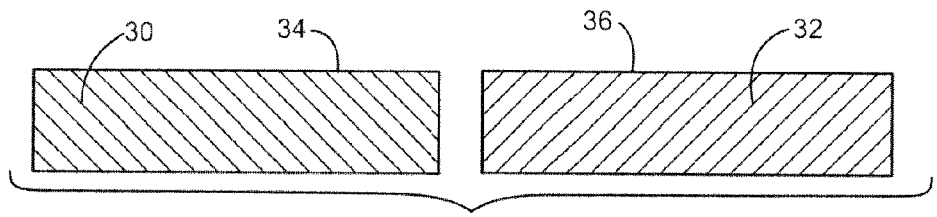
FIG. 7 is a series of cross-sectional views illustrating a process for depositing layers of Ti, Pt, Au, Pt and Pd on the surface of a laser diode substrate to metal bonding in order to obtain a low electrical resistance ohmic contact) across the interface between the substrates.
Figure 7B:
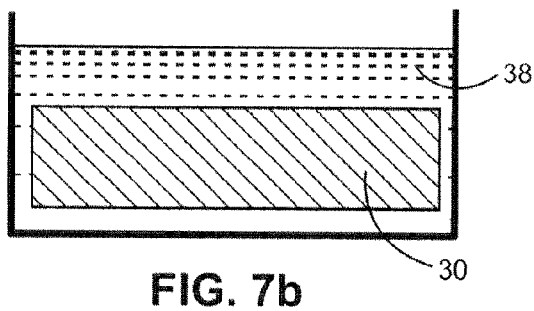
Figure 7C:
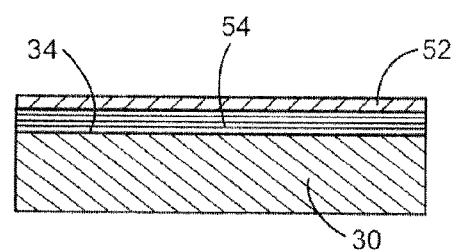
Figure 7D:
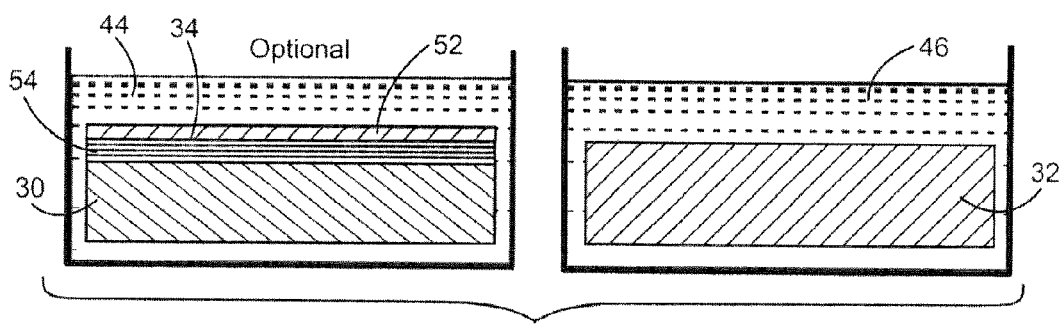
Figure 7E:
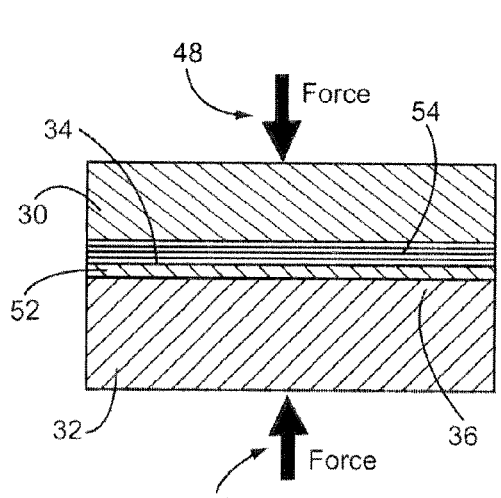
Figure 7F:
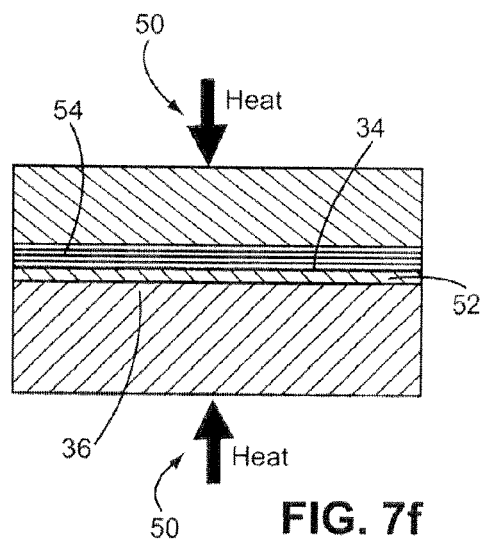

FIG. 3 is a photograph of the laser diode bar 11 adjoined to the metal heat sink 13 using the solder material 14. As can be seen at the solder interface 14, the solder 14 has re-flowed to form a solder re-flow 18, and migrated up along the laser diode output facet 19. The consequence of the solder re-flow 18 is to destroy the ability of the laser diode 11 to properly operate.

Figure 4:
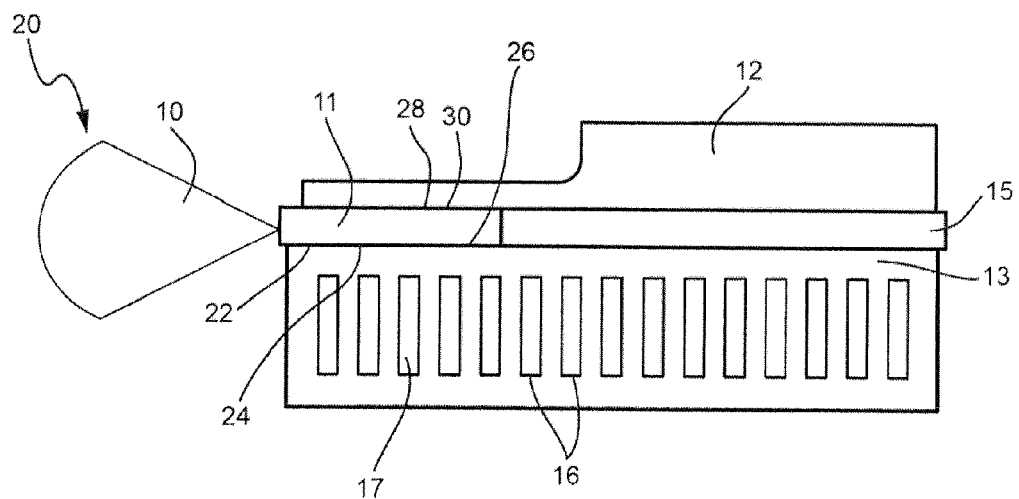
FIG. 4 is an illustration of the implementation of a laser diode system of the present invention, in which direct substrate bonding is used to bond a laser diode device or laser diode array to a metal substrate without the use of an intermediate layer such as a solder. The metal substrate in this implementation functions as both a heat sink and as an electrode to the laser diode device(s). The laser diode or laser diode array is mated to a heat sink with microchannel cooling capability fabricated into the heat sink to facilitate the removal of heat from the laser diode(s). This configuration is very similar to the method used to bond laser diodes to metal substrates using solder as illustrated in FIG. 1 above, however in FIG. 4 the semiconductor substrate is direct bonded to the metal substrate without the use of an intermediate layer of solder.

FIG. 4 is an illustration of a laser diode system 20 formed according to the present invention, in which the semiconductor diode laser substrate 11 is directly bonded to the metal substrate 13 on the bottom surface 22 of the semiconductor substrate and the top surface 24 of the metal substrate 13. The metal substrate 13 in system 20 again functions as a heat sink and also as a p-contact electrode to the semiconductor substrate 11. Moreover, the metal substrate 13 in this configuration also has microchannels 16 that have been machined into the metal in order allow coolant fluid 17 to pass through, and thereby facilitate the transfer of heat away from the semiconductor substrate 11 and into the metal heat sink 13 and coolant fluid 17. Importantly, there is no intermediate solder layer between the semiconductor substrate 11 and the bottom metal substrate 13. This has several beneficial effects. First, the thermal resistance across the semiconductor/metal interface 26 is much lower, which facilitates the removal of heat away from the power dissipating semiconductor devices on substrate 11. Second, there is less residual stress and strain in the semiconductor material since the bonding of the semiconductor and metal substrates 11 and 13 can be performed at low temperatures. Third, there will not be any re-flow of the solder away from the semiconductor/metal interface 26 since no solder was used in the joining process. These benefits translate into higher performance and reliability for the laser diode system 20.

As shown in FIG. 4, the semiconductor substrate 11 has also been direct bonded to the top n-contact electrode 12 without a solder intermediate layer, as well as the bottom p-contact electrode/heat sink 13. Specifically, the system 20 employs metal substrates 12 and 13 bonded to both the top and bottom surfaces 28 and 22, respectively, of the semiconductor substrate 11. It should be recognized that, an alternative approach would be to have a metal substrate bonded to the semiconductor substrate 11 only on the bottom or top side of the semiconductor substrate 11 with some other means being used to make electrical contact to the other side (e.g., wire bonding). As shown in FIG. 4 with metal electrode/heat sink substrates 12 and 13 bonded to both sides of the semiconductor substrate 11, the thermal resistance on the interfaces 26 and 30 between metal substrates 13 and 12, respectively, and semiconductor substrate 11 is reduced, thereby allowing increased levels of heat to be transferred away from the semiconductor substrate 11 and laser diode devices made into the semiconductor substrate 11, as well as reduced residual stresses at the top interface 30 and eliminating the possibility of solder re-flow from the top interface 30.

Another advantage of the present invention is that the overhang of the output facet of the laser diode 11 can be reduced or eliminated. Present manufacturing technology for light emitting devices such as laser diodes 11 requires an overhang or protrusion of approximately 5 or 10 microns so the solder used to join the laser diode 11 to the heat sink 13 does not wick onto the output facet of the laser diode 11 thereby blocking the laser radiation 10 from emanating from the laser diode 11. As a result, the waste heat in the vicinity of the output facet is not removed efficiently resulting in overheating of this region or section of the laser diode 11 which can cause a catastrophic failure of the laser diode 11. The present invention does not require this overhang, since no solder used to affix the laser diode 11 to the metal substrate heat sink/electrode 13. This enables the laser diode 11 to be located right at the edge of the heat sink or metal substrate electrode 13 thereby eliminating the overhang with the result that waste heat can be more effectively removed from the laser diode 11 resulting in improved laser diode performance, longevity and reliability.

The bonding of the semiconductor laser diode substrate 11 to the metal substrates 12 and 13, as shown in FIG. 4, requires that the semiconductor substrate 11 and metal substrates 12 and 13 meet several criteria for the bonding to be of high yield and strength. Specifically, the substrates should be sufficiently smooth, sufficiently flat, and sufficiently clean and free of particles. Once the requirements to achieve good bonding on the substrates surfaces have been satisfied, the bonding of the metal substrates 12 and 13 to the semiconductor substrate 11 is performed.

The criteria of flatness and smoothness of two substrates to be bonded can be achieved using a number of methods available in the semiconductor fabrication domain, including chemical-mechanical polishing or CMP. Once sufficient flatness (typically <1 um non-flatness over a 2 cm diameter) and smoothness (typically a few Angstroms to a few nanometers root mean square surface roughness) are obtained, the substrates can then be bonded.

A preferred method of low-temperature bonding of a Gallium Arsenide ("GaAs") semiconductor substrate 30 containing a laser diode or laser diode array to a metal substrate 32 is shown in FIGS. 5($a$)-($e$). The first step (FIG. 5($a$)) is to insure that the surfaces 34 and 36 of the substrates 30 and 32, respectively, to be bonded are sufficiently lapped and polished so as to meet with criteria of substrate surface smoothness and flatness as described above. The next step (FIG. 5($b$)) is to clean the GaAs semiconductor substrate 30. The cleaning procedure for Gallium Arsenide (GaAs), a compound semiconductor material used in opto-electronic applications, such as laser diodes, involves the removal of organic and metal contaminates from the surface 34 to be bonded, as well as the removal of any oxides on the surface 34 to be bonded. The type of solutions used for these purposes varies depending on the type of semiconductor substrates. For semiconductor substrates composed of Gallium Arsenide (GaAs), an organic solvent solution 38 can be used to clean the surface 34 of the GaAs substrate 30 of organic contamination. For example, in one method the solution 38 involves a multiple step process consisting of: (1) immersion in boiling trichloroethane 1,1,1 (TCE) for 5 to 15 minutes, (2) immersion in boiling acetone for 5 to 15 minutes (3) immersion in methanol at room temperature for 5 to 15 minutes; and lastly, (4) immersion in isopropanol (IPA) for 5 to 15 minutes at room temperature. Ultrasonic agitation may also be used to facilitate the cleaning process for one or more of the immersion steps in this process. Although this is one method for cleaning GaAs, there are many other solutions known and used in the semiconductor industry for cleaning substrates made from this semiconductor material and can be used in the present invention.

The removal of any native oxide on the surface 34 of the GaAs substrate 30 is extremely important to ensure that the interface 42 between the bonded GaAs substrate 30 and the metal substrate 32 is electrically conducting. Therefore, as shown in FIG. 5($c$), immersion of the GaAs substrate 30 in a solution 44 consisting of a mixture of NH4OH and H2O in the approximate proportions ranging from 10:1 to 20:1 for 1 to 5 minutes under agitation or irrigation will remove the native oxide on the surface 34 of substrate 30 prior to bonding.

Alternatively, the solution 44 could also be a dilute acidic mixture, such as HCl and H2O in the proportions of 1:1, or a mixture of H3PO4 and H2O in the proportions of 1:1, or a mixture of H2SO4 in H2O in the proportions of 1:1, either of which would also be sufficient to remove the native oxide on the surface 34 of the GaAs substrate 30 prior to bonding. It is noteworthy that other solutions are known to remove native oxides from GaAs substrates and can be used in the present invention. Furthermore, other solutions may be used to remove native oxides from the surfaces of other types of semiconductor substrate materials and would be used in the present invention as appropriate.

To bond the GaAs substrate 30 to the metal substrate 32, the metal substrate 32 must also be properly cleaned and prepared prior to bonding. First however, it is important that the metal substrate 32 have a sufficient smooth and flat surface 36 as was described earlier and this may be obtained using Chemical Mechanical Polishing or a similar technique. Once the metal surface 36 is adequately smooth and flat, it will then be cleaned using an appropriate solution 40 suitable for the metal material being used. The exact type of cleaning method used will depend on the type of metal or metal alloy to be bonded to the semiconductor, but for the case of bonding a GaAs substrate 30 to a copper (Cu) or mostly Cu metal substrate 32, the cleaning first involves the removal of any organic contamination on the surface using the organic contamination process appropriate for the Copper, followed by the removal of native oxides using, as shown in F*igure* 5($c$), an immersion in a solution 46 consisting of Acetic Acid (CH3COOH) at a concentration of up to a 4 vol % water dilution at 35 degrees Celsius for a few minutes. Optionally, the Acetic Acid may be only used to both clean the metal substrate 32 as well as remove any native oxide on the surface 36.

Alternatively, the metal substrate native oxide can be removed by the immersion of the metal substrate into a solution of electrolyzed anode water for a few minutes and with agitation if desired.

Similarly to the descriptions provided above for the cleaning and removal of native oxides from the semiconductor substrates 30, the solutions used for cleaning and removal of oxides from metal substrates 32 is based on the material type from which the metal substrate 32 is composed. Furthermore, there are numerous methods known in industry for cleaning as well as removing native oxides from the surfaces 36 of most metals and most can be used in the present invention. However, it is noted that any solution used to clean or remove native oxide does not cause the surface 36 of the metal substrate 32 to become any rougher since this would degrade the ability to subsequently bond the metal substrate 32 to a semiconductor substrate 30.

The two substrates 30 and 32 are then rinsed and dried using an appropriate method. The method of drying depends on the exact type of semiconductor and metal substrates to be bonded, but will usually involve the blowing of an inert gas across the substrate surface to force any liquid to be removed, or placing the substrate in a vacuum to evaporate any remaining liquids from the surfaces 34 and 36 of substrates 30 and 32. Heating of the substrates may also be employed to dry the substrates 30 and 32.

Next, the substrates 30 and 32 are then physically contacted to pre-bond them together (FIG. 5($d$)) by placing the polished surfaces 34 and 36 of the two substrates 30 and 32 together, and preferably pressing them together to facilitate the bonding process. Alternatively, a uniformly applied normal force 48 may be used to facilitate the bonding of the two substrates 30 and 32. The substrates 30 and 32 can be aligned prior to the physical contacting to register the features or devices on one substrate to the features or devices on the other substrate. Alignment of the semiconductor substrate 30 to the metal substrate 32 can be performed using equipment used in the semiconductor industry such that the registration accuracy of the two substrates 30 and 32 is done with great precision (i.e., +/−1 micron registration accuracy).

Lastly, the pre-bonded substrates 30 and 32 are annealed at an elevated temperature 50 to strengthen the bond between the substrates 30 and 32. This annealing is performed in a non-oxidizing ambient (e.g., Nitrogen, Argon, or similar gas) at 50 degrees Celsius or higher and for a time of 15 minutes or longer. A force to apply pressure during the anneal may be used to facilitate the bonding of the two substrates 30 and 32 to one another.

Although the method of the present invention described in FIGS. 5(*a*)-(*e*) refers to a GaAs semiconductor substrate 30, this method is equally applicable for other types of semiconductor substrates used for embodying laser diode and laser diode array device(s), such as Indium Phosphide (InP), Aluminum Gallium Arsenide (AlGaAs), and many others.

In addition to cleaning the surfaces 34 and 36, a surface activation may be performed to facilitate the bonding of substrates 30 and 32. Activation of the surfaces 34 and 36 means intentionally treating the surfaces to terminate the molecular bonds at the substrate surface with dipole molecules, with the result of increasing the bonding strength due to the strong dipole-to-dipole attractions across the bond interface 42.

A variation of the surface activation process is "plasma activation" of the surfaces, which is performed prior to physically contacting the substrates 30 and 32. It is used to create a high level of charging of the surface 34 and 36 of the substrates 30 and 32 that not only increases the strength of substrate bond, but also allows high-strength substrate bonding to be achieved even with a relatively low temperature anneal. For example, one form of plasma activation is to expose the surfaces of the substrates 34 and 36 to an Oxygen (O2) plasma for a few seconds to a few minutes of time.

The bonding of the laser diode semiconductor substrate 30 to the metal substrate 32 requires a low resistance electrical conduction through the bonded interface 42 between the substrates. Therefore, it is important that any native oxides are removed from each of the substrates 30 and 32 prior to bonding. Native oxides readily form on the surfaces of many material types and usually result in an oxide that is at least a few Angstroms to a few nanometers in thickness. The exact method for removal of the native oxide will vary depending on the substrate materials to be bonded.

Additionally, to obtain a low resistance electrical conduction across the interface 42, that is, to obtain an ohmic contact across the interface 42, it is preferable to perform additional processing steps. It is known that when two dissimilar materials are bonded together, any electrical conduction across the interface 42 may be rectifying, i.e., non-ohmic. To ensure low resistance and linear electrical conductance across the interface 42 between the bonded semiconductor laser diode 30 substrate and metal substrate 32, a thin-film metal layer 52 is deposited on the surface 34 of semiconductor substrate 30 that readily reacts or alloys with the semiconductor substrate at low temperatures. For example, it is known that Palladium (Pd) is an elemental metal that readily reacts with elemental semiconductors (e.g., Silicon, Germanium, etc.) as well as compound semiconductors (e.g., Gallium Arsenide, Indium Phosphide, etc.) at very low temperatures (e.g., less than 200 degrees Celsius). Moreover, it is also known that the Palladium will displace any native oxides on the surfaces of semiconductors, while not oxidizing itself to create its own unwanted native oxide.

Therefore, to ensure low resistance electrical conductance across the interface 42 between a bonded semiconductor laser diode substrate 30 and a metal substrate 32 is to deposit a thin layer of Palladium 52 on the surface 34 of the semiconductor substrate 30 (See FIGS. 6(*a*)-(*f*) or on the surface 36 of the metal substrate 32, or both, after the respective surfaces 34 and 36 have been suitably prepared and cleaned to ensure that the selected surface(s) 34 and/or 36 is sufficiently flat and smooth and all contaminants had been removed from the surface(s) 34 and/or 36, as described above and illustrated in FIGS. 6(*a*) to 6(*d*). The thickness of the deposited Palladium layer 52 can be tailored to facilitate the bonding, and will typically vary from a few hundred Angstroms to a few microns thick. Generally, a thicker Palladium layer will be used, if the surfaces to be bonded are rougher or less flat. After the deposition of the Palladium on the surface(s) 34 and/or 30 of either the semiconductor or metal substrate 32, or both, the substrates 30 and 32 are physically contacted, as shown in FIG. 6(*e*) and pressed together using a moderate amount of normal force 48 (e.g., a few PSI) or more. It is important to apply the force 48 between the two substrates 30 and 32 as uniform as possible, since any asymmetry in the application of the force 48 can result in breakage of the semiconductor substrate 30. Higher applied force between the substrates 30 and 32 facilitates the bonding process, and therefore, it can be desirable to increase the applied force 48 up to a few Atmospheres. This is particularly helpful if the surfaces 34 and 36 are rough, non-flat and/or unclean. The pre-bonded substrates 30 and 32 are then annealed at a temperature 50 of between 50 and 400 degrees Celsius or more to complete the bonding. A force may be applied during the anneal to facilitate the bonding. Alternatively, a layer of Gold (Au) of the same thickness may be substituted for the Palladium layer or alternatively a layer of Palladium and Gold may be used on one or both surfaces of the substrates to obtain ohmic contact across the bonded interface 42.

FIG. 7 illustrates a variation of the method shown in FIG. 6. In this case, to facilitate making an ohmic contact between the metal and semiconductor substrates 32 and 30, with the semiconductor substrate 30 being GaAs in this example, a stack of thin film layers 54 is deposited on the surface 34 of the semiconductor substrate 30 (See FIG. 7(*c*)) or on the surface 36 of the metal substrate 32, or both, after the respective surfaces 34 and 36 have been suitably prepared and cleaned to ensure that the selected surface(s) 34 and/or 36 is/are sufficiently flat and smooth and all contaminants had been removed from the surface(s) 34 and/or 36, as described above and illustrated in FIGS. 7(*a*) to 7(*d*). Specifically, stack 54 includes a thin-film layer of Titanium, followed by a thin-film layer of Platinum, followed by a thin-film layer of Gold, followed by another thin-film layer of Platinum, and lastly followed by the deposition of a thin-film layer of Palladium 52. Preferably, all of these thin-film material layers will be deposited in the same chamber without breaking vacuum to ensure that the surfaces of the metals are not exposed to the environment. The thicknesses of the individual thin-film material layers is not critical, but all layers should at least be 100 Angstroms in thickness or more and the thickness of the Palladium layer 52 can vary from several hundred Angstroms to several microns depending on the surface smoothness and flatness. That is, a thicker Palladium layer 52 will be used if the surfaces 34 and 36 to be bonded are rougher and less flat. Alternatively, the Palladium layer 52 may be deposited onto the metal substrate 32 or both the semiconductor and metal substrates 30 and 32. Other layers of metals and other combinations of layers may be used depending on the type of material used in the semiconductor substrate 30.

After the deposition of the Palladium 52 on the surface of either the semiconductor substrate 30 or metal substrate 32, or both, the substrates 30 and 32 are physically contacted and pressed together using a moderate amount of normal force 48 (e.g., several PSI) or more (FIGS. 6(*e*) and 7(*e*)). It is important to apply the force 48 between the two substrates 30 and 32 as uniformly as possible, since any asymmetry in the application of the force can result in breakage of the semiconductor substrate 30. Higher applied force between the substrates 30 and 32 facilitates the bonding process, and therefore, it can be desirable to increase the applied force up to several Atmospheres. This is particularly helpful if the surfaces 34 and 36 are rough, non-flat and/or unclean. The pre-bonded substrates 30 and 32 will then be annealed at a temperature 50 of between 50 and 400 degrees Celsius or more to complete the bonding (FIGS. 6(f) and 7(f)).

Figure 8:
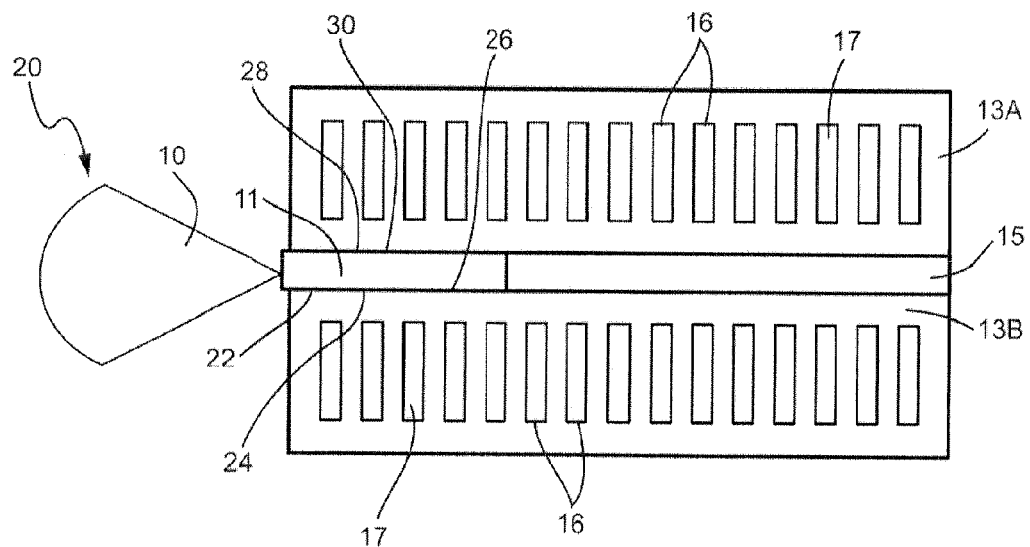
FIG. 8 is an illustration of an implementation of a laser diode system in which heat sinks with microchannel cooling capability fabricated into them are bonded onto both sides of the laser diode or laser diode array to facilitate the removal of heat from the laser diode(s).

FIG. 8 illustrates an embodiment of the present invention, wherein two metal substrates 13A and 13B are bonded to two sides (e.g., top and bottom) of a semiconductor substrate 11 containing a laser diode or laser diode array using the semiconductor substrate to metal substrate bonding techniques described herein, and without the use of any intermediate solder layers for the bonding. Specifically, the metal substrates 13A and 13B on both sides of the laser diode substrate 11 act as electrodes and heat sinks that contain microchannels 16 for coolant fluid 17 to pass through them, thereby facilitating heat removal from the laser diode substrate 11. The ability to have a microchannel cooling plate on both sides of the laser diode or laser diode array greatly facilitates the removal of heat from the device during operation, and thereby improve its performance and reliability. It should be noted that those numerals used in FIG. 8 (and in FIG. 9) like or similar to those used in FIG. 4, refer to the same or similar components.

Figure 9:
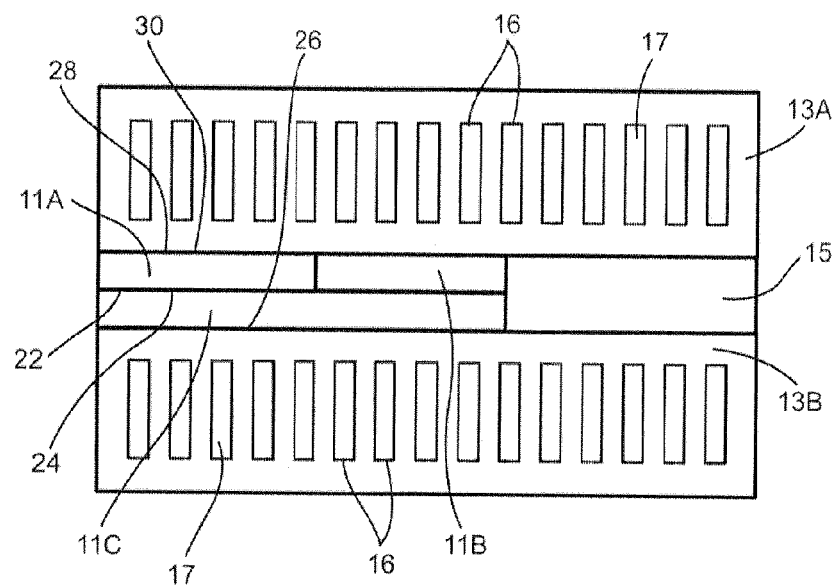
FIG. 9 is an illustration of bonding a silicon semiconductor microelectronics die to a metal substrate and also bonding different types of semiconductor substrates with different functionalities, such as photonics and MEMS, to semiconductor and metal substrates, thereby realizing a merged technology capability.

FIG. 9 illustrates the use of the semiconductor to metal bonding technique described herein to form a complex system that combines one or more semiconductor substrates or dies 11 with one or more metal substrates 13. The semiconductor substrates 11 can include any number of technologies fabricated into them, including microelectronics, photonics, and/or MEMS designed to operate with and control a laser diode or laser diode array fabricated in one of the substrates 11A, 11B or 11C described below. The advantage of having these technologies fabricated in the semiconductor substrate 11 is the ability to monitor and control, for example, the current flowing to the laser diode or laser diode array. This is particularly useful where one of the laser diodes in an array, such as a bar with multiple diodes, fails or is drawing an excessive amount of current that might lead to its failure. This design will also allow the manufacturer and user the option of taking automatic protective measures that will improve the reliability, performance and lifetime of the electronic/photonic components.

The metal substrates 13 shown in FIG. 9 can perform one or more functions including: a mechanical support; a heat sink (with cooling fins, heat pipes, capillary pumped loops, 2-phase cooler, spray coolers, etc.); electrodes to supply current and/or voltage to the semiconductor devices; and metal shielding to protect the active devices made in the semiconductor substrates 11A-C. As shown in FIG. 9, a semiconductor substrate 11A with photonic devices fabricated in it is bonded to a semiconductor silicon substrate 11B with microelectronics fabricated in it, and likewise a semiconductor or metal substrate 11C with MEMS device(s) fabricated in it is bonded to the microelectronics substrate. This composite stack of three substrates, i.e., photonics substrate 11A, microelectronics substrate 11B, and MEMS substrate 11C, is then bonded to metal substrate 13A and 13B on the top and bottom surfaces 30 and 26 of the stack of semiconductor substrates. In this configuration, the metal substrates 13A and 13B act as heat sinks and as electrodes. It is understood that the configuration illustrated in FIG. 9 is only one of many possible configurations, and that the present invention covers all possible configurations in which multiple semiconductor and metal substrates are bonded together to form complex systems. Furthermore, it is understood that the multiple substrate bondings as shown in FIG. 9 can be performed in a number of different sequences. That is, a semiconductor can be bonded to a metal substrate, followed by bonding this composite pair to another semiconductor or metal substrate, and so on.

Figure 10A:
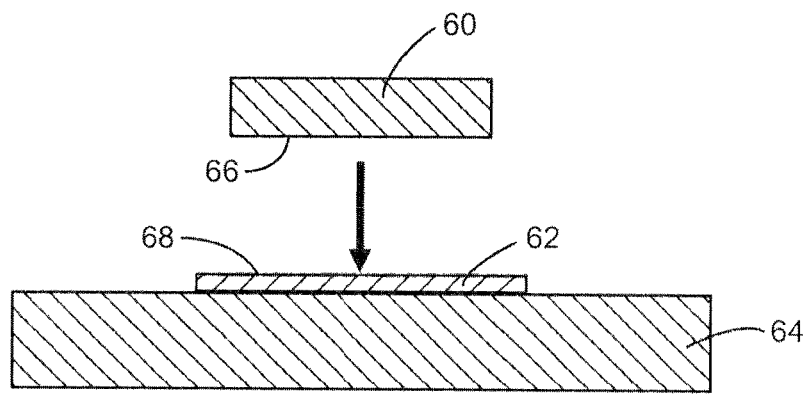
FIG. 10 is a series of cross-sectional views illustrating the bonding without an intermediate layer of solder of a semiconductor laser diode device to a metal layer fabricated on a semiconductor or ceramic substrate that can function as a (passive or active) heat sink.
Figure 10B:
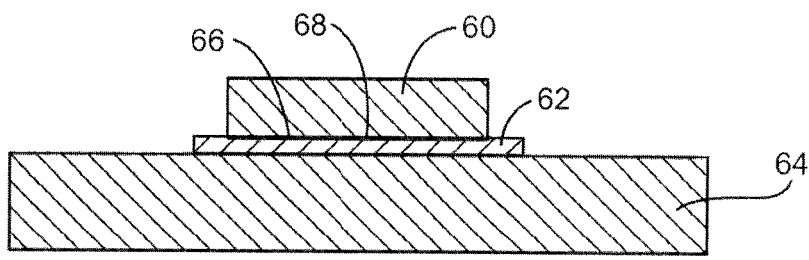
Figure 10C:
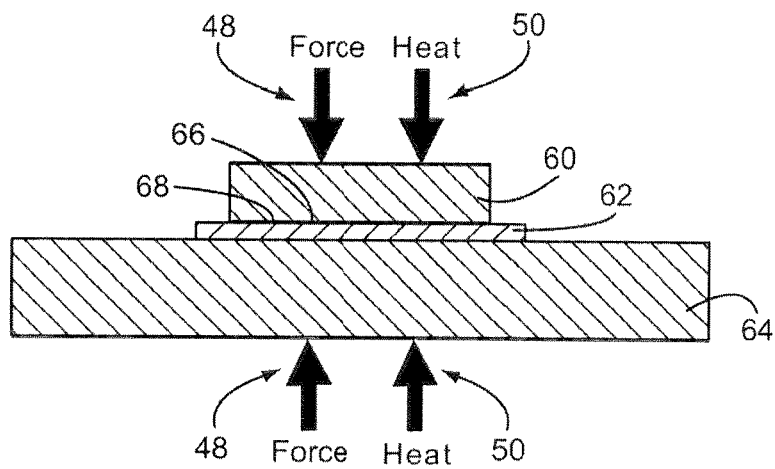

FIGS. 10(a)-(c) illustrate another configuration wherein a laser diode device 60 is bonded to a metal layer 62 deposited on a semiconductor substrate or ceramic substrate 64. The metal layer 62 deposited on the semiconductor or ceramic substrate 64 functions as electrodes that enable electrical power to be delivered to the laser diode device 60. Waste heat from the laser diode device 60 is removed by semiconductor or ceramic substrate 64 that functions as an active or passive heat sink. For example, the semiconductor or ceramic substrate 64 may have microchannel coolers (see FIGS. 1, 4, 8 and 9) or some other passive or active cooling capability fabricated into it. Such an architecture has the advantage of eliminating electrolysis action, from which metal microchannel coolers suffer when they act as both electrodes and active heat sinks. Electrolysis limits the lifetime of the device. Also, such a design does not require deionized water which is corrosive and needs additional equipment. Ceramics may have other advantages, such as the ability of machining finer pore sizes, or using diamond in the case of passive, or active, waste heat removal. Diamond has an extraordinary high thermal conductivity allowing large amounts of heat to be removed from the laser diode device.

Figure 11A:
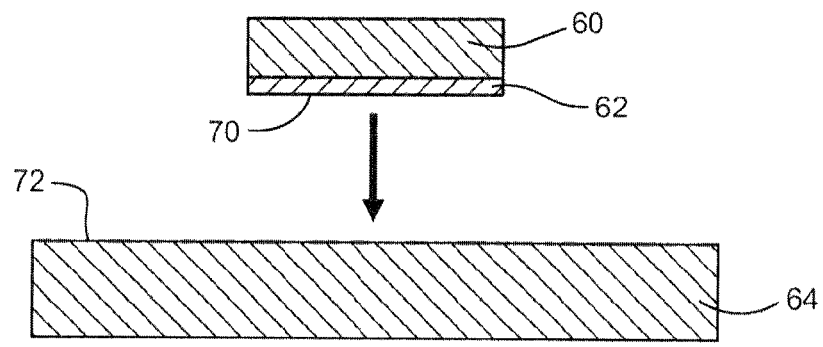
FIG. 11 is a series of cross-sectional views illustrating the bonding without an intermediate layer of solder of a semiconductor laser diode device coated with a metal layer to a semiconductor or ceramic substrate that can function as a (passive or active) heat sink.
Figure 11B:
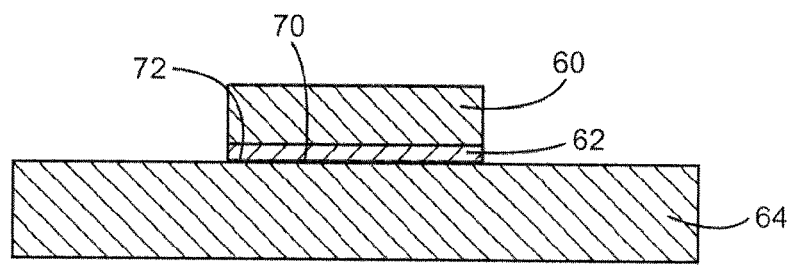
Figure 11C:
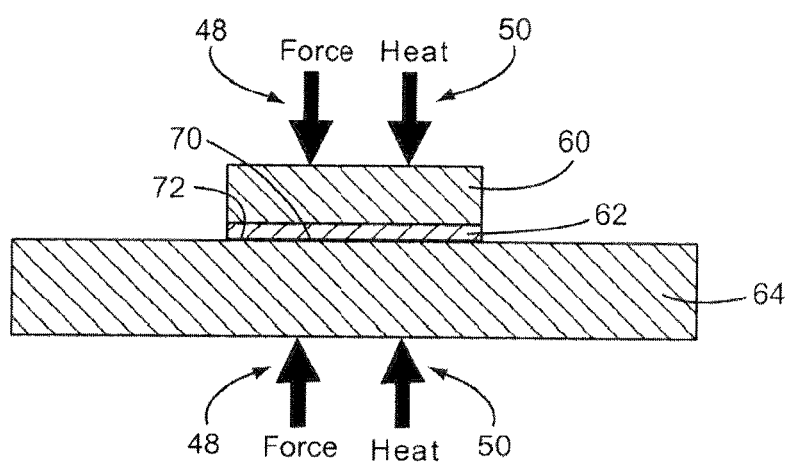

FIGS. 11(a)-(c) illustrates another embodiment of the present invention similar to that shown in FIGS. 10(a)-(c), except that the metal layer 62 is deposited onto the laser diode 60 device, which is then bonded to semiconductor or ceramic substrate 64. It should be noted that the application of the pre-bonding force 48 and annealing heat 50 shown in FIGS. 10(c) and 11(c) is similar to that previously described herein and is applied after surfaces 66 and 68 of laser device 60 and metal layer 62, respectively, shown in FIGS. 10(a)-(c), and surfaces 70 and 72 of metal layer 62 and substrate 64, respectively, shown in FIGS. 11(a)-(c) have been suitably prepared and cleaned, as discussed above, to ensure that such surfaces are sufficiently flat and smooth and all contaminants have been removed.

FIGS. 12 (a)-(c) illustrate another embodiment of the present invention. FIG. 12(a) shows a ceramic substrate 80 with a series of electrodes 81 that have been patterned from a layer of metal on a surface of the ceramic substrate 80. FIG. 12(b) shows a metal substrate 82 that is configured as a heat sink with channels 83 machined into the interior of the metal substrate 82. A coolant fluid is passed through the channels 83 to facilitate heat transfer from the metal substrate 82 to the fluid. A laser diode bar 84 is bonded to the metal substrate 82 using the techniques of the present invention. The laser diode bar 84 includes a number of laser diode emitters 86, each of which emits laser radiation when operated. A series of electrodes 85 are patterned from layer of metal material deposited onto a top surface of the laser diode bar 84. FIG. 12(c) shows the ceramic substrate 80 flipped over and bonded to the metal substrate 82 so as to sandwich the laser diode bar substrate 84 between the ceramic substrate 80 and the metal substrate 82, such that the ceramic substrate 80 electrodes 81 are aligned to the electrodes 85 on the metal substrate. The technique for bonding used to bond these substrates is described above. The embodiment of FIGS. 12 (a)-(c) allows individual addressability of the individual laser diode emitters 86 in laser diode bar 84. For example, a silicon substrate having driver electronics fabricated into it could be merged into the embodiment of FIGS. 12(a)-(c) so as to individually control the voltage and current applied to each of the laser diode emitters 86 in the laser diode bar 84, thereby implementing an integrated smart laser diode system.

There are a number of benefits obtained from individual addressing of emitters in a bar or array of radiation emitting semiconductor junction devices. Those benefits include, but not are not limited to, the following.

First, where a particular emitter fails, power can be removed from the emitter to improve the efficiency of the bar or array. An emitter can fail in one of three possible ways, i.e., (i) as a short, (ii) as an open; and (iii) where the emitter remains as a diode. Where the emitter fails as a short, because the bar or array is driven by a common electrical supply for all of the emitters, all or most of the current will flow through the failed, shorted, emitter, robbing current and power from the other emitters in the bar. Where the emitter fails as an open, again, because the bar or array is driven by a common, constant current electrical supply for all of the emitters, there will be an increase in the current to the remaining emitters, resulting in over-heating, accelerated failure and a change in the wavelength and optical power of the laser radiation emanating from the other, remaining emitters. Where the emitter remains as a diode, all of the electrical power flowing through the failed emitter will be waste heat (as compared to approximately 50% for a functional emitter). If the emitter remains as a diode, the configuration results in a larger thermal load on the thermal management subsystem and the bar then operates at a higher temperature, resulting in an accelerated failure of the remaining emitters in the bar or array.

Second, in the event that there is a fault detected in an emitter, electrical power does not have to be removed from the entire bar (See U.S. Patent Publication No. 2007-0210854-A1, corresponding to U.S. patent application Ser. No. 11/624,870, both of which are incorporated by reference in their entirety.). This is less disruptive to the total laser system.

Third, the signal to noise of the electrical faults should be much higher, as the fault detection circuitry observes the electrical transients from just the one emitter, and its signal is not attenuated by the other emitters in the bar (Fault protection is disclosed in U.S. Patent Publication No. 2007-0210854-A1, corresponding to U.S. patent application Ser. No. 11/624,870.).

Fourth, since, in a bar or array, emitters typically do not have identical impedances, providing current individually to each emitter in the bar or array results in efficient operation and increased lifetime. In addition, as the array ages, the variation in the impedance of each of the individual emitters can be accounted for, resulting in a more stable operation.

Fifth, in an individually addressable bar or array, the current to each emitter can be adjusted to optimize parameters, such as the emitted wavelength, emitted power and, in some instances, the phase of the emitted radiation. Such adjustments can result in improved performance.

Finally, for an individually addressable array or bar, the individual power supplies and/or intelligent power supplies can be designed as an integrated circuit (integrated with the array or bar in one instance) for ease of integration.

It should be noted that, according to these teachings, wafers/substrates and predetermined materials can be chosen such that components and compounds have higher melting temperatures so the bond does not liquefy or sublime.

A significant benefit of the present invention is the mating of substrates with the purpose of reducing the thermal resistance of the pathway from a power dissipating semiconductor laser diode or laser diode device(s) to the metal substrate that the semiconductor devices(s) are mated to that may be serving as a heat sink, thereby allowing the active laser diode device(s) to be kept at a lower operational temperature for a given power dissipation. Furthermore, the present invention can also be used to make low electrical resistance contacts between a metal substrate material and a semiconductor laser diode substrate material, thereby allowing voltage and/or current to be applied to the semiconductor laser diode device(s). Other significant benefits of the present invention include an increase in the reliability of laser diode semiconductor devices, and especially high-power laser diodes, as well as enabling individual addressability and enhanced operational control of laser diode semiconductor devices through the merging of different semiconductor and metal substrates or different material types. Furthermore, the present invention allows the successful bonding of material substrates having different thermal expansion coefficients at relatively low temperatures, and the bonding of metal substrates on both sides of laser diode and laser diode array substrates to obtain more effective thermal control and/or higher device performance.

While the invention has been described in connection with what is presently considered to be the most practical and preferred embodiments, it is to be understood that the invention is not to be limited to the disclosed embodiments, but on the contrary, is intended to cover various modifications and equivalent arrangements included within the spirit and scope of the appended claims.

What is claimed is:

1. A method of bonding a semiconductor substrate to a metal substrate without the use of any intermediate joining or soldering layer between the two substrates, the method comprising the steps of:

providing a metal substrate, providing a semiconductor substrate made from substantially Gallium Arsenide ("GaAs"), fabricating on the GaAs substrate a laser diode or laser diode array, lapping and polishing a surface of the GaAs substrate and a surface of the metal substrate so that each surface has a predetermined level of smoothness and a predetermined level of flatness, cleaning the surfaces of the semiconductor and metal substrates using suitable solutions for the semiconductor and metal substrates so as to remove from the surfaces of the semiconductor and metal substrates particulates of a predetermined size, contaminants and residues, removing from the surfaces of the semiconductor and metal substrates any native oxides using appropriate solutions for the semiconductor and metal substrates, rinsing and drying the surfaces of the semiconductor and metal substrates and pre-bonding said surfaces together by physically contacting said surfaces together with a predetermined level of force, and annealing the semiconductor and metal substrates for a predetermined period of time and a predetermined elevated temperature to thereby bond the semiconductor and metal substrates together.

2. The method of claim 1, wherein a predetermined level of force is applied to the substrates during the annealing step to bond the substrates together.

3. The method of claim 1, wherein the step of cleaning the surface of the GaAs semiconductor comprises the steps of (1) immersing the GaAs semiconductor in boiling trichloroethane 1,1,1 ("TCE") for a first period of time between approximately five minutes and approximately 15 minutes, (2) immersing the GaAs semiconductor in boiling acetone for a second period of time between approximately five minutes and approximately 15 minutes, (3) immersing the GaAs semiconductor in methanol at room temperature for a third period of time between approximately five minutes and approximately 15 minutes, and (4) immersing the GaAs semiconductor in isopropanol ("IPA") at room temperature for a fourth period of time between approximately five minutes and approximately 15 minutes.

4. The method of claim 3, wherein the step of cleaning the surface of the GaAs semiconductor further comprises subjecting the GaAs semiconductor to ultrasonic agitation for one or more of the immersion steps.

5. The method of claim 1, wherein the step of removing the native oxides comprises the step of immersing the GaAs substrate in a solution having a mixture of NH4OH and H2O.

6. The method of claim 5, wherein the solution for cleaning the surfaces and removing the native oxide is a mixture of NH4OH and H2O in a proportion between approximately 10:1 and approximately 20:1 for a period of time between approximately 1 minute and approximately 5 minutes under agitation or irrigation.

7. The method of claim 1, wherein the step of cleaning the surfaces and removing the native oxides comprises the step of immersing the GaAs substrate in a dilute acidic solution having a mixture of HCl and H2O in a proportion of approximately 1:1.

8. The method of claim 1, wherein the step of cleaning the surfaces and removing the native oxides comprises the step of immersing the GaAs substrate in a dilute acidic solution having a mixture of H3PO4 and H2O in a proportion of approximately 1:1.

9. The method of claim 1, wherein the step of cleaning the surfaces and removing the native oxides comprises the step of immersing the GaAs substrate in a dilute acidic solution having a mixture of H2SO4 and H2O in a proportion of approximately 1:1.

10. The method of claim 1, wherein the metal substrate is cleaned using an acidic or basic aqueous solution suitable for the metal material being used for the metal substrate.

11. The method of claim 10, wherein the metal substrate is Copper or has a proportion of its composition made from Copper, and wherein the metal substrate has the native oxides removed from the surface by immersing the metal substrate in a solution of acetic acid (CH3COOH) at a concentration of approximately 4 vol % water dilution or less at 35° C. for approximately several minutes.

12. The method of claim 10, wherein the metal substrate native oxide is removed by the immersion of the metal substrate into a solution of electrolyzed anode water for a predetermined amount of time.

13. The method of claim 12, wherein the solution is agitated.

14. The method of claim 1, wherein the step of drying the surfaces of the semiconductor and metal substrates comprises blowing an inert gas across said surfaces to remove any liquid on said surfaces.

15. The method of claim 1, wherein the step of drying the surfaces of the semiconductor and metal substrates comprises placing the substrates in a vacuum to evaporate any liquids on the surfaces of the substrates.

16. The method of claim 1, wherein the step of pre-bonding the semiconductor and metal substrate surfaces together further comprises compressing the semiconductor and metal substrates together with a predetermined amount of force after physically contacting said substrates together.

17. The method of claim 1, wherein the predetermined annealing period of time is approximately at least 15 minutes and wherein the predetermined elevated annealing temperature is approximately at least 50° C.

18. The method of claim 17, wherein the step of annealing the semiconductor and metal substrates is performed in a non-oxidizing ambient gas that is Nitrogen or Argon.

19. The method of claim 1, further comprising the step of activating the surfaces of the semiconductor and metal substrates by treating the surfaces of the semiconductor and metal substrates to terminate molecular bonds at said substrate surfaces with dipole molecules, with the result of increasing bonding strength due to the strong dipole-to-dipole attractions across the bond interface.

20. The method of claim 19, wherein the step of activating the surfaces is performed using plasma activation prior to physically contacting and annealing the semiconductor and metal substrate surfaces.

21. The method of claim 1, wherein at least one thin film metal layer is deposited on the surface of the GaAs substrate prior to physically contacting and annealing the GaAs and metal substrate surfaces, to thereby obtain a low electrical conduction across an interface between the GaAs and metal substrates.

22. The method of claim 21, wherein the thin film metal layer is Palladium.

23. The method of claim 21, wherein the thin film metal is Gold.

24. The method of claim 21, wherein the thin film metal is a layer of Palladium and Gold.

25. The method of claim 1, wherein a stack of thin film metal layers is deposited on the surface of the GaAs substrate prior to physically contacting and annealing the semiconductor and metal substrate surfaces, to thereby obtain a low electrical conduction across an interface between the GaAs and metal substrates.

26. The method of claim 25, wherein the stack of thin film metal layers is formed from a thin-film layer of Titanium, followed by a thin-film layer of Platinum, followed by a thin-film layer of Gold, followed by another thin-film layer of Platinum, and lastly followed by a second thin-film layer of Palladium.

27. The method of claim 26, wherein all of the thin film metal layers forming the stack of thin film metal layers are deposited in the a common vacuum chamber without breaking vacuum to ensure that the surfaces of the thin film metal layers are not exposed to the environment.

28. The method of claim 22, wherein each of the thin film metal layers forming the stack of thin film metal layers has a thickness of at least 100 Angstroms.

29. The method of claim 22, wherein the thin-film Palladium layer has a thickness between approximately several hundred Angstroms and several microns, depending on the surface smoothness and flatness of the GaAs substrate.

30. The method of claim 29, wherein a Palladium layer greater than several microns will be used if the surfaces to be bonded are rougher and less flat.

31. The method of claim 22, wherein the thin-film Gold layer has a thickness between approximately several hundred Angstroms and several microns, depending on the surface smoothness and flatness of the GaAs substrate.

32. The method of claim 29, wherein a Gold layer greater than several microns will be used if the surfaces to be bonded are rougher and less flat.

33. The method of claim 22, wherein the thin-film Palladium and Gold layers each have a thickness between approximately several hundred Angstroms and several microns, depending on the surface smoothness and flatness of the GaAs substrate.

34. The method of claim 29, wherein the Palladium and Gold layers each of which is greater than several microns will be used if the surfaces to be bonded are rougher and less flat.

35. The method of claim 1, wherein a thin film metal layer of Palladium is deposited on the surface of the metal substrate prior to physically contacting and annealing the GaAs and metal substrate surfaces, to thereby obtain a low electrical conduction across an interface between the GaAs and metal substrates.

36. The method of claim 1, wherein a thin film metal layer of Palladium is deposited on the surfaces of the GaAs and metal substrate prior to physically contacting and annealing the GaAs and metal substrate surfaces, to thereby obtain a low electrical conduction across an interface between the GaAs and metal substrates.

37. The method of claim 1, wherein, after the GaAs and metal substrates are physically contacted together, the substrates are pressed together using an amount of normal pressure of approximately several PSI or more.

38. The method of claim 37, wherein the pressure applied between the GaAs and metal substrates is substantially uniform, so as to avoid asymmetry or non-uniformity in the application of the force that can result in breakage of the GaAs substrate.

39. The method of claim 37, wherein the pressure applied between the GaAs and metal substrates is approximately several Atmospheres to thereby facilitate the bonding between the GaAs and metal substrates where the surfaces of the GaAs and metal substrates are rough, non-flat and/or unclean.

40. The method of claim 1, wherein the pre-bonded GaAs and metal substrates are annealed at a temperature at least between approximately 50 and 400 degrees Celsius.

41. The method of claim 1, wherein the metal substrate is formed so as to function as a heat sink to transfer heat away from the laser diode or laser diode array fabricated on the GaAs substrate.

42. The method of claim 41, wherein the metal substrate has micro-channels machined into it to allow coolant fluid to pass through the metal substrate, and thereby facilitate the transfer of heat away from the laser diode or laser diode array fabricated on the GaAs substrate and into the coolant fluid and the metal substrate heat sink.

43. The method of claim 41, wherein the metal substrate has one or more heat pipes, capillary-pumped loops, 2-phase cooler, and/or spray coolers fabricated within to facilitate the transfer of heat away from the laser diode or laser diode array fabricated on the GaAs substrate and into the coolant fluid and the metal substrate heat sink.

44. The method of claim 1, further comprising providing first and second metal substrates, and wherein the GaAs substrate has first and second bonding surfaces, and wherein each of the first and second metal substrates has a bonding surface, the first metal substrate's bonding surface and the second metal substrate's bonding surface being bonded to the GaAs substrate's first and second bonding surfaces, respectively.

45. The method of claim 1, wherein the metal substrate is formed so as to function as an electrode to the laser diode or laser diode array fabricated on the GaAs substrate.

46. A method of bonding together substrates without the use of any intermediate joining or soldering layer between the two substrates, the method comprising the steps of:
providing a semiconductor substrate with a laser diode or a laser diode array fabricated in the semiconductor substrate,
providing at least one metal substrate formed to function as a heat sink and/or electrode to the laser diode substrate,
polishing a surface of the metal substrate and a surface of the laser diode substrate so that each surface has a predetermined level of smoothness and a predetermined level of flatness,
cleaning the surface of the metal substrate and the surface of the laser diode substrate so as to remove from each surface particulates of a predetermined size, contaminants and residues,
bonding together the metal substrate and the laser diode substrate by contacting the surface of the metal substrate with the surface of the semiconductor substrate.

47. The method of claim 46, wherein the surfaces of the laser diode and metal substrate are activated prior to the physical contacting of the surfaces of the substrates.

48. The method of claim 46, wherein the surfaces of the laser diode and metal substrates have a force applied to the substrates during or after the physical contacting of the surfaces of the substrates.

49. The method of claim 46, wherein the laser diode and metal substrates are annealed for a predetermined period of time and a predetermined elevated temperature to thereby bond the metal substrate and the semiconductor substrate together.

50. The method of claim 49, wherein the surfaces of the laser diode and metal substrates have a force applied to the substrates during the anneal.

51. The method of claim 46, wherein the laser diode substrate is bonded to at least one second semiconductor substrate prior to bonding of the laser diode substrate to the metal substrate.

52. The method of claim 46, wherein the laser diode substrate is bonded to second and third semiconductor substrates prior to bonding of the laser diode substrate to the metal substrate, and wherein the second and third semiconductor substrates include microelectronic, photonic and/or MEMS devices fabricated into them.

53. The method of claim 46, wherein the metal substrate is a thin, metal layer fabricated on a second semiconductor or ceramic substrate, including microelectronic, photonic and/or MEMS devices fabricated into it, and wherein the laser diode substrate is bonded to the metal substrate after the metal substrate has been fabricated on the second semiconductor or ceramic substrate.

54. The method of claim 46, wherein the metal layer functions as an active or passive heat sink to remove waste heat from the laser diode substrate.

55. The method of claim 46, wherein the metal substrate is a thin, metal layer fabricated on a second semiconductor substrate that includes microelectronic, photonic and/or MEMS devices fabricated into it, and wherein the metal substrate is bonded to the laser diode substrate.

56. The method of claim 55, wherein the metal layer functions as electrodes that enable power to be delivered to any devices on the second semiconductor substrate.

57. The method of claim 55, wherein a ceramic substrate is substituted for the second semiconductor substrate.

58. The method of claim 46, wherein the predetermined particulates size is particulates being sub-micron or larger in diameter.

59. The method of claim 53, wherein the semiconductor substrate contains a plurality of laser diode emitters in a laser diode bar and the metal substrate contains a plurality of electrodes in order to individually address and control each of the laser diodes in the laser diode bar.

60. The method of claim 59, wherein the semiconductor substrate contains a plurality of laser diode emitters in a laser diode bar, and wherein each laser diode emitter has a separate electrode fabricated on its top surface and the metal substrate contains a plurality of electrodes in order to individually address and control each of the laser diodes in the laser diode bar.

61. A method of bonding together a semiconductor substrate and a metal substrate without the use of any intermediate joining or soldering layer between the two substrates, the method comprising the steps of:
  providing a semiconductor substrate having a predetermined level of smoothness and a predetermined level of flatness and having a laser diode or a laser diode array fabricated in the semiconductor substrate,
  providing at least one metal substrate having the predetermined level of smoothness and the predetermined level of flatness,
  cleaning the surface of the metal substrate and the surface of the laser diode substrate so as to remove from each surface particulates of a predetermined size, contaminants and residues,
  bonding together the metal substrate and the laser diode substrate by contacting the surface of the metal substrate with the surface of the semiconductor substrate.

62. The method of claim 46, wherein the first and second metal substrates function as electrodes to the laser diode or laser diode array fabricated on the GaAs substrate.

63. The method of claim 46, wherein each of the first and second metal substrates is formed so as to function as a heat sink to transfer heat away from the laser diode or laser diode array fabricated on the GaAs substrate.

64. The method of claim 46, wherein each of the first and second metal substrates has micro-channels machined into it to allow coolant fluid to pass through the metal substrate, and thereby facilitate the transfer of heat away from the laser diode or laser diode array fabricated on the GaAs substrate and into the coolant fluid and the metal substrate heat sink.

65. The method of claim 46, wherein the first and second metal substrates have one or more heat pipes, capillary-pumped loops, two-phase coolers, and/or spray coolers fabricated within to facilitate the transfer of heat away from the laser diode or laser diode array fabricated on the GaAs substrate and into the coolant fluid and the metal substrate heat sink.

66. The method of claim 46, wherein the first metal substrate is formed so as to function as an n-type contact to the to the laser diode or laser diode array fabricated on the GaAs substrate and the second metal substrate is formed so as to function as an p-type contact to the laser diode or laser diode array fabricated on the GaAs substrate.

\* \* \* \* \*